US010274999B2

(12) United States Patent
Yin et al.

(10) Patent No.: US 10,274,999 B2
(45) Date of Patent: Apr. 30, 2019

(54) WATER-COOLING DEVICE

(71) Applicant: ASIA VITAL COMPONENTS CO., LTD., New Taipei (TW)

(72) Inventors: Jian-Wu Yin, New Taipei (TW); Rong-Xian Zhang, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 198 days.

(21) Appl. No.: 14/923,447

(22) Filed: Oct. 27, 2015

(65) Prior Publication Data

US 2017/0118870 A1    Apr. 27, 2017

(51) Int. Cl.
*G06F 1/20* (2006.01)
*H01L 23/34* (2006.01)
*F04D 13/06* (2006.01)

(52) U.S. Cl.
CPC ............. *G06F 1/20* (2013.01); *F04D 13/064* (2013.01); *H01L 23/34* (2013.01)

(58) Field of Classification Search
CPC ..... G06F 1/20; G06F 2200/201; H01L 23/34; F04D 13/064; F04D 29/5806
See application file for complete search history.

(56) References Cited

U.S. PATENT DOCUMENTS

| | | | |
|---|---|---|---|
| 6,945,315 B1* | 9/2005 | Gektin | F28D 15/00 165/104.31 |
| 2009/0155099 A1* | 6/2009 | Lai | F04D 13/0673 417/410.1 |
| 2013/0220582 A1* | 8/2013 | Eriksen | H01L 23/473 165/104.31 |
| 2014/0216695 A1* | 8/2014 | Tsai | H01L 23/473 165/104.31 |

* cited by examiner

*Primary Examiner* — Jon T. Schermerhorn, Jr.
(74) *Attorney, Agent, or Firm* — Jackson IPG PLLC; Demian K. Jackson

(57) ABSTRACT

A water-cooling device includes a liquid reservoir main body having a heat exchange chamber, a pump having a stator and a rotor and a heat exchange component connected with the liquid reservoir main body. The heat exchange chamber is for a cooling liquid to pass through. The rotor is connected with an impeller and exposed to the cooling liquid in the heat exchange chamber. The stator is integrally embedded in the liquid reservoir main body by embedded injection molding. The stator is isolated from the heat exchange chamber. According to the design of the water-cooling device, the structural strength of the liquid reservoir main body is enhanced and a waterproof effect for the stator is achieved.

7 Claims, 6 Drawing Sheets

WATER-COOLING DEVICE

BACKGROUND OF THE INVENTION

1. Field of the Invention

The present invention relates generally to a water-cooling device, and more particularly to a water-cooling device, which is able to enhance the structural strength of the liquid reservoir main body and provide waterproof effect for the stator.

2. Description of the Related Art

It is known that the operation performances of electronic apparatuses have become higher and higher. As a result, in operation, the electronic components disposed in the electronic apparatuses will generate a great amount of heat. In general, it is necessary to arrange a heat sink or radiating fins on the electronic components to increase the heat dissipation area and enhance the heat dissipation efficiency. However, the heat sink and the radiating fins can only achieve a limited heat dissipation effect. Therefore, a conventional water-cooling device is often employed to enhance the heat dissipation efficiency.

The conventional water-cooling device serves to absorb the heat generated by a heat generation component (such as a central processing unit or graphics processing unit) and heat-exchange with a cooling liquid contained in the water-cooling device. A pump is disposed in the water-cooling device to circulate the cooling liquid. The water-cooling device is connected to a heat sink through multiple tube bodies. Accordingly, the cooling liquid can circularly flow within the heat sink and the water-cooling device to heat-exchange with the heat sink and dissipate the heat. In this case, the heat generated by the heat generation component can be quickly dissipated.

However, when the pump in the conventional water-cooling device operates, the stator assembly also will generate heat. In the conventional water-cooling device, the stator assembly is isolated from the cooling liquid and is self-cooled by way of air cooling. Therefore, the cooling effect is poor. As a result, the heat often over-accumulates around the stator assembly to cause burnout of the stator assembly. Moreover, the heat accumulation problem of the stator will affect the lifetime of the water-cooling device.

In the conventional water-cooling device, in order to prevent the stator assembly of the pump from being damaged due to contact with the liquid, the stator assembly is disposed on outer side of the water-cooling device, while the rotor assembly for guiding the cooling liquid to circulate within the water-cooling device is disposed in the chamber of the water-cooling device. The rotor is separated from the corresponding stator by the outer case of the water-cooling device and driven by the magnetized stator. The outer case of the water-cooling device must be designed in consideration of the structural strength of the water-cooling device itself. Therefore, the outer case of the water-cooling device has a considerable thickness. Accordingly, the thickness of the outer case of the water-cooling device leads to a gap between the rotor assembly and the stator assembly to affect the operation efficiency of the pump. As a result, as a whole, the heat dissipation performance of the water-cooling device is affected. Also, the total volume of the water-cooling device is excessively large.

SUMMARY OF THE INVENTION

It is therefore a primary object of the present invention to provide a water-cooling device in which the stator is integrally embedded in the liquid reservoir main body by embedded injection molding. Therefore, the structural strength of the liquid reservoir main body is effectively enhanced.

It is a further object of the present invention to provide the above water-cooling device in which the stator and the circuit board are integrally enclosed in the liquid reservoir main body so that a true waterproof effect for the stator and the circuit board is achieved to protect the stator and the total volume of the water-cooling device is reduced.

It is still a further object of the present invention to provide the above water-cooling device in which the thickness gap between the stator and the corresponding rotor is shortened, whereby the operation efficiency of the pump is greatly increased.

It is still a further object of the present invention to provide the above water-cooling device in which the heat generated by the stator of the pump can be indirectly carried away by the cooling liquid to dissipate the heat of the stator.

To achieve the above and other objects, the water-cooling device of the present invention includes a liquid reservoir main body, a pump and a heat exchange component. The liquid reservoir main body has an inlet, an outlet, a receiving space and a heat exchange chamber in communication with the receiving space, the inlet and the outlet. One side of the heat exchange chamber of the liquid reservoir main body is recessed to form the receiving space. The heat exchange chamber is for a cooling liquid to pass through. The pump serves to circulate the cooling liquid. The pump includes a stator and a rotor. The stator is integrally embedded in the liquid reservoir main body by embedded injection molding. The stator is isolated from the receiving space and the heat exchange chamber. The rotor is connected with an impeller. The rotor and the impeller are respectively disposed in the receiving space and the heat exchange chamber and exposed to the cooling liquid. The heat exchange component is connected with the liquid reservoir main body. The heat exchange component has a heat contact face and a heat exchange face. The heat exchange face is in contact with the cooling liquid in the heat exchange chamber. According to the design of the water-cooling device of the present invention, the stator is entirely enclosed in the solid enclosure structure of the liquid reservoir main body to increase the structural strength of the liquid reservoir main body and achieve waterproof effect for the stator and the circuit board. Furthermore, the stator and the circuit board are protected from being damaged and the operation efficiency of the pump is enhanced.

Still to achieve the above and other objects, the water-cooling device of the present invention includes a liquid reservoir main body, a pump and a heat exchange component. The liquid reservoir main body has an inlet, an outlet, a receiving space, a perforation and a solid enclosure structure. The solid enclosure structure is integrally formed in the middle of the liquid reservoir main body. The solid enclosure structure and the corresponding liquid reservoir main body together define a heat exchange chamber in communication with the outlet and a pump chamber in communication with the inlet. The perforation passes through the solid enclosure structure. The pump chamber is positioned above the heat exchange chamber in communication with the heat exchange chamber through the perforation. One side of the pump chamber of the liquid reservoir main body is recessed to form the receiving space. The pump chamber is for a cooling liquid to pass through. The pump serves to circulate the cooling liquid. The pump includes a stator and a rotor. The stator is integrally embedded in the solid enclosure structure by embedded injection molding. The stator is positioned between the pump chamber and the heat exchange chamber. The stator is isolated from the receiving space, the heat exchange chamber and the pump chamber. The rotor is connected with an impeller. The rotor and the impeller are respectively disposed in the receiving space and the pump chamber and exposed to the cooling liquid. The heat exchange component is connected with the liquid reservoir main body. The heat exchange component has a heat contact face and a heat exchange face. The heat exchange face is in contact with the cooling liquid in the heat exchange chamber. According to the design of the water-cooling device of the present invention, the stator is entirely enclosed in the solid enclosure structure of the liquid reservoir main body to increase the structural strength of the liquid reservoir main body and achieve heat dissipation and waterproof effect for the stator and the circuit board. Furthermore, the stator and the circuit board are protected from being damaged.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
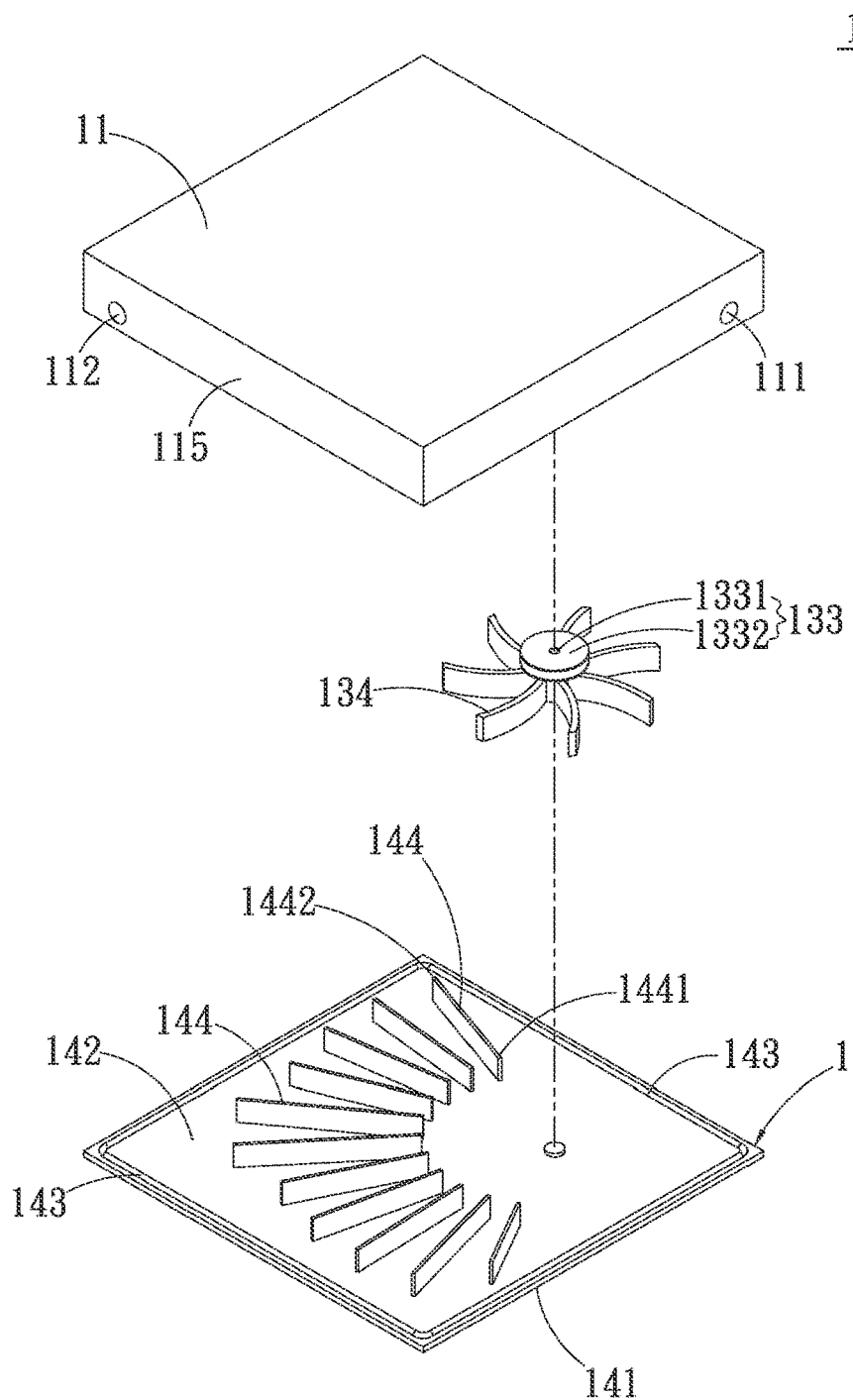
FIG. 1 is a perspective exploded view of a first embodiment of the present invention.
Figure 2:
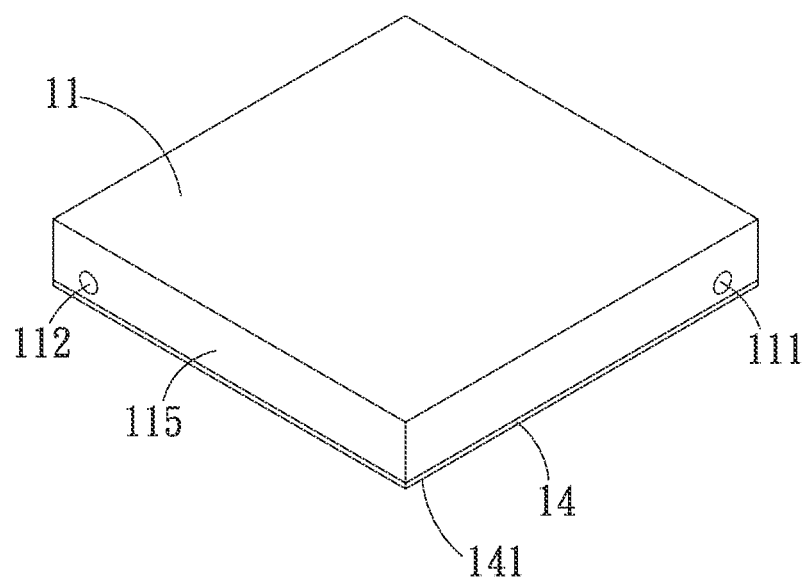
FIG. 2 is a perspective assembled view of the first embodiment of the present invention.
Figure 3:
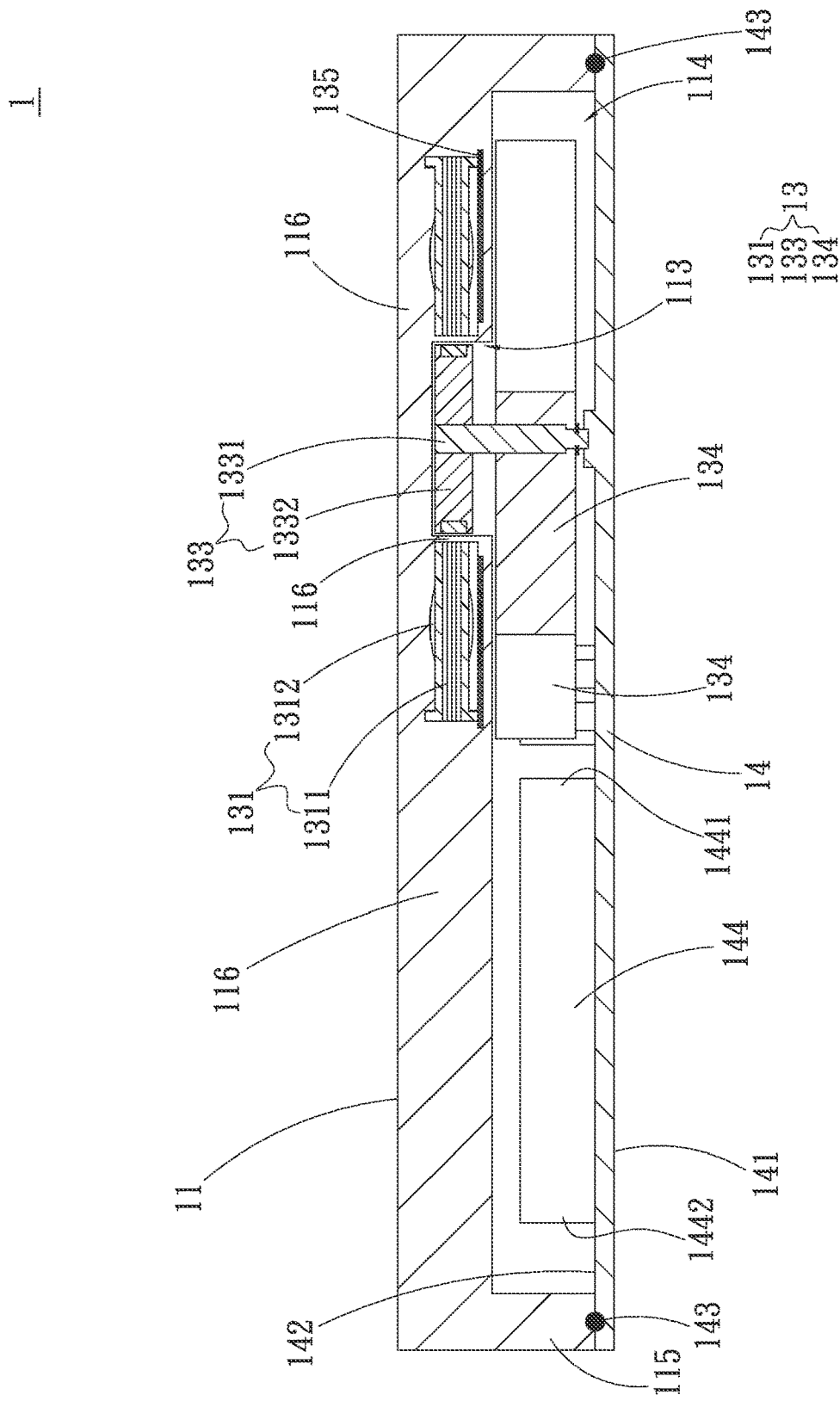
FIG. 3 is a sectional view of the first embodiment of the present invention.
Figure 4:
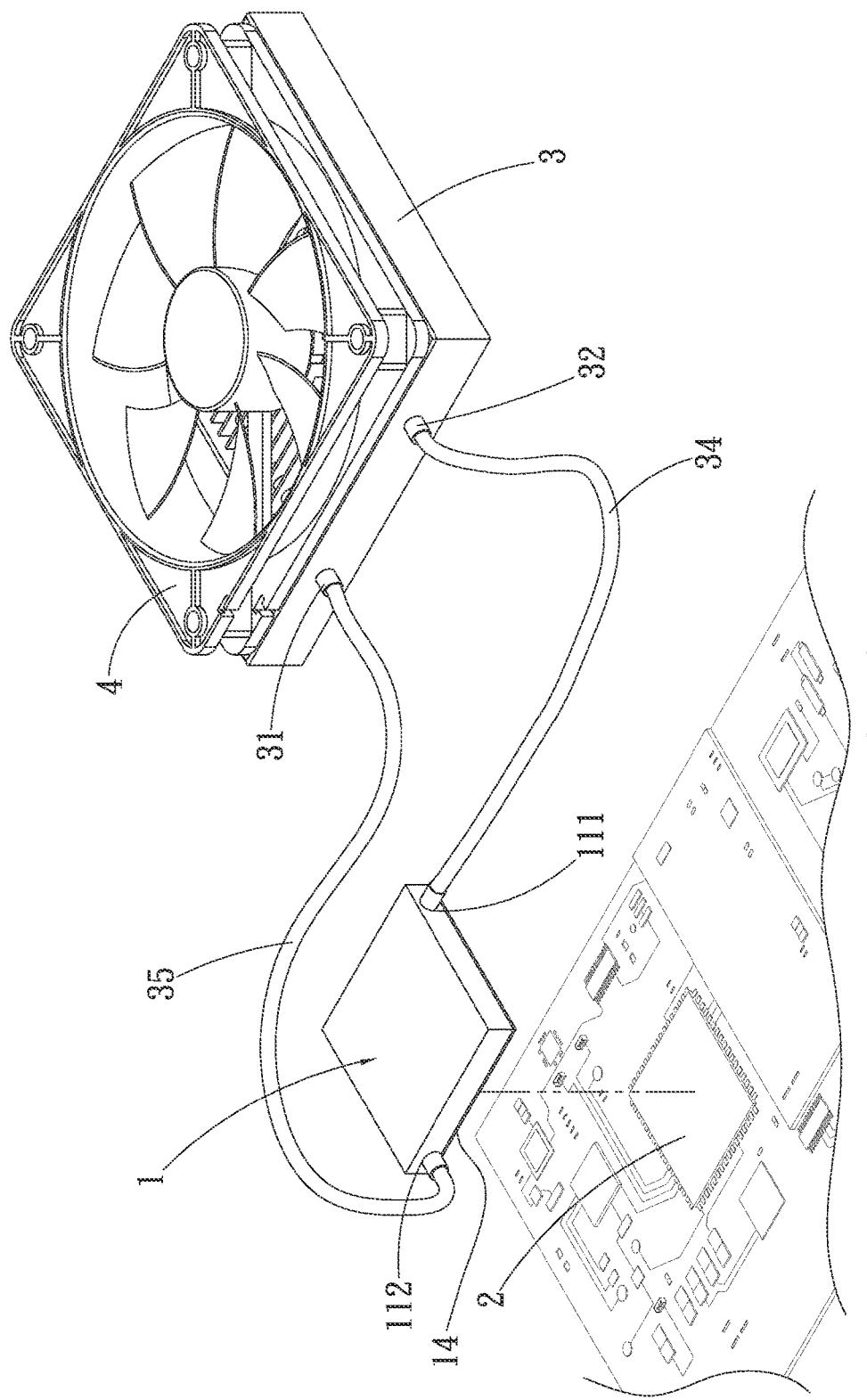
FIG. 4 is a perspective exploded view of a second embodiment of the liquid-cooling system of the present invention.

Please refer to FIGS. 1 and 2 and supplementally to FIG. 3. FIG. 1 is a perspective exploded view of a first embodiment of the present invention. FIG. 2 is a perspective assembled view of the first embodiment of the present invention. FIG. 3 is a sectional view of the first embodiment of the present invention. The water-cooling device 1 of the present invention is applied to a heat generation component 2 (such as a central processing unit or graphics processing unit as shown in FIG. 4). The water-cooling device 1 includes a liquid reservoir main body 11, a pump 13 and a heat exchange component 14. The liquid reservoir main body 11 is made of plastic material and has an inlet 111, an outlet 112, a receiving space 113, a peripheral wall 115, a heat exchange chamber 114 and a solid enclosure structure 116. The peripheral wall 115 downward extends from the liquid reservoir main body 11. The liquid reservoir main body 11 and the peripheral wall 115 together define the heat exchange chamber 114. The heat exchange chamber 114 communicates with the receiving space 113, the inlet 111 and the outlet 112. The heat exchange chamber 114 is for a cooling liquid to pass through. The solid enclosure structure 116 is positioned above the heat exchange chamber 114. One side of the heat exchange chamber 114 of the liquid reservoir main body 11 is recessed to form the receiving space 113. The receiving space 113 is positioned above the heat exchange chamber 114 in adjacency to the corresponding solid enclosure structure 116.

The inlet 111 and the outlet 112 are respectively disposed on two lateral sides of the liquid reservoir main body 11. The heat exchange component 14 is connected with the peripheral wall 115 of the liquid reservoir main body 11. That is, the bottom of the peripheral wall 115 of the liquid reservoir main body 11 is connected with one face of the heat exchange component 14 to seal the heat exchange chamber 114. The heat exchange chamber 114 is positioned between the heat exchange component 14 and the liquid reservoir main body 11. A gasket 143 is disposed between the peripheral wall 115 and the heat exchange component 14 for enhancing the connection tightness between the liquid reservoir main body 11 and the heat exchange component 14 and avoiding leakage of the cooling liquid in the heat exchange chamber 114. The connection means between the heat exchange component 14 and the liquid reservoir main body 11 is, but not limited to, insertion for illustration purposes. In practice, the insertion means alternatively can be welding, adhesion or screwing.

The heat exchange component 14 is made of high-heat-conductivity metal such as aluminum, copper, gold or silver. The heat exchange component 14 has a heat contact face 141, a heat exchange face 142 and multiple radiating fins 144. The heat contact face 141 is tightly attached to the heat generation component 2 (such as a central processing unit or graphics processing unit). The heat contact face 141 serves to absorb the heat generated by the heat generation component 2 and conduct the heat to the heat exchange face 142. The heat exchange face 142 is positioned in the heat exchange chamber 114 in contact with the cooling liquid contained in the heat exchange chamber 114. The radiating fins 144 are disposed on the heat exchange face 142. In this embodiment, the radiating fins 144 are, but not limited to, radially arranged at intervals for illustration purposes. Each radiating fin 144 has a first end 1441 and a second end 1442. The first ends 1441 of the radiating fins 144 are proximal to an impeller 134. The second ends 1442 of the radiating fins 144 radially extend away from the impeller 134. The radiating fins 144 are disposed on the heat exchange face 142 to greatly increase the heat exchange area. Therefore, when the heat contact face 141 of the heat exchange component 14 absorbs the heat generated by the heat generation component 2 and conducts the heat to the heat exchange face 142, the heat exchange face 142 and the radiating fins 144 disposed thereon will heat-exchange with the cooling liquid. Accordingly, the cooling liquid can carry the heat of the heat exchange face 142 and the radiating fins 144 away and flow out from the outlet 112 of the liquid reservoir main body 11 to achieve heat dissipation effect.

The pump 13 serves to circulate the cooling liquid. The pump 13 includes a stator 131, a rotor 133 and the impeller 134. The stator 131 is integrally embedded in the liquid reservoir main body 11 by embedded injection molding. That is, in integral injection molding of the liquid reservoir main body 11, the stator 131 is entirely embedded and enclosed in the solid enclosure structure 116 of the liquid reservoir main body 11. The liquid reservoir main body 11 and the stator 131 enclosed therein form an integrated body. In the present invention, the stator 131 is integrally enclosed in the liquid reservoir main body 11 by means of embedded injection molding so that the structural strength of the liquid reservoir main body 11 is enhanced and the waterproof and protection effect for the stator 131 can be ensured. In contrast, in the conventional water-cooling device, the stator is covered by a thin outer cover so that the structural strength is not idealistic. Also, the tightness of the thin outer cover covering the stator is poor. As a result, the thin outer cover is apt to detach and the water is easy to infiltrate into the stator to cause short-circuit of the stator.

Moreover, the solid enclosure structure 116 integrally encloses the stator 131 so that the thickness of the solid enclosure structure 116 can be thinned to effectively reduce the total volume and shorten the thickness gap between the stator 131 and the corresponding rotor 133. In this case, the operation efficiency of the pump can be greatly increased. Also, in operation, the heat generated by the stator 131 can be conducted to the solid enclosure structure 116 for the solid enclosure structure 116 to absorb the heat and heat-exchange with the cooling liquid in the heat exchange chamber 114 to dissipate the heat. Under such circumstance, the heat is prevented from accumulating around the stator 131 so that the lifetime of the water-cooling device can be prolonged.

Please further refer to FIGS. 1 and 3. The stator 131 is isolated from the receiving space 113 and the heat exchange chamber 114. The stator 131 includes a silicon steel sheet assembly 1311 and a winding assembly 1312 wound on the silicon steel sheet assembly 1311. In this embodiment, the silicon steel sheet assembly 1311 is, but not limited to, composed of multiple silicon steel sheets stacked on each other. In practice, the silicon steel sheet assembly 1311 alternatively can be a one-piece silicon steel bar with a substantially U-shaped configuration or any other shape. A circuit board 135 is electrically connected with the winding assembly 1312. The circuit board 135, the silicon steel sheet assembly 1311 and the winding assembly 1312 wound thereon are together enclosed in the solid enclosure structure 116 of the liquid reservoir main body 11. In addition, the silicon steel sheet assembly 1311 and the winding assembly 1312 wound thereon (the stator 131) and the circuit board 135 are positioned outside the heat exchange chamber 114 and the receiving space 113. The solid enclosure structure 116 of the liquid reservoir main body 11 isolates the stator 131 from contact of the cooling liquid in the heat exchange chamber 114. In other words, the stator 131 is not in contact with the cooling liquid. In addition, in practice, the circuit board 135 can be alternatively disposed in a position beside the stator 131 instead of the position under the stator 131.

The rotor 133 is connected with the impeller 134. The rotor 133 and the impeller 134 are respectively disposed in the receiving space 113 and the heat exchange chamber 114. The rotor 133 and the impeller 134 are exposed to the cooling liquid. Therefore, the rotor 133 is separated from the stator 131 by the liquid reservoir main body 11. The stator 131 serves to drive the rotor 133 to urge the impeller 134 to rotate. Accordingly, the impeller 134 disturbs the cooling liquid in the heat exchange chamber 114, whereby the cooling liquid flowing in from the inlet 111 is driven by the impeller 134 to flow out from the outlet 112. The rotor 133 has a shaft 1331 and a magnetic member 1332. One end of the shaft 1331 is connected with the impeller 134, while the other end of the shaft 1331 is rotatably disposed at the bottom of the receiving space 113. The magnetic member 1332 (such as a magnet) is fitted on the other end of the shaft 1331. The magnetic member 1332 is separated from the stator 131 by the solid enclosure structure 116 of the liquid reservoir main body 11 corresponding to the stator 131.

According to the design of the water-cooling device 1 of the present invention, the stator 131 is entirely enclosed in the solid enclosure structure 116 of the liquid reservoir main body 11 to increase the structural strength of the liquid reservoir main body 11 and achieve the protection effect for the stator 131. Furthermore, the solid enclosure structure 116 of the liquid reservoir main body 11 provides a very good sealing effect so that the water or alien objects (such as salt fog or dust or other liquid) are effectively prevented from infiltrating into and rusting the stator 131.

In a modified embodiment, the heat exchange component 14 is free from any radiating fin. Instead, the heat exchange face 142 absorbs the heat and directly heat-exchanges with the cooling liquid to dissipate the heat.

Please now refer to FIG. 4, which is a perspective exploded view of a second embodiment of the liquid-cooling system of the present invention. Also referring to FIGS. 1 and 3, in this embodiment, the water-cooling device 1 of the first embodiment is connected with a heat sink 3 to form a liquid-cooling system. The water-cooling device 1 of the second embodiment is substantially identical to the water-cooling device of the first embodiment in structure, connection relationship and effect and thus will not be repeatedly described hereinafter. As shown in the drawings, the heat sink 3 is positioned in a position distal from the liquid reservoir main body 11. The liquid reservoir main body 11 is correspondingly connected to the heat sink 3.

The heat sink 3 has a heat sink inlet 31, a heat sink outlet 32, a first flexible tube 34 and a second flexible tube 35. One end of the first flexible tube 34 is connected to the corresponding inlet 111 of the liquid reservoir main body 11. The other end of the first flexible tube 34 is connected to the heat sink outlet 32. One end of the second flexible tube 35 is connected to the corresponding outlet 112 of the liquid reservoir main body 11. The other end of the second flexible tube 35 is connected to the heat sink inlet 31. Accordingly, through the first and second flexible tubes 34, 35, the heat sink 3 is respectively connected to the inlet 111 and outlet 112 of the liquid reservoir main body 11. The impeller 134 in the heat exchange chamber 114 serves to drive the cooling liquid to circularly flow within the heat exchange chamber 114 and the heat sink 3.

In addition, the heat sink 3 can be connected with a fan 4 to help the heat sink 3 to quickly dissipate the heat. As shown in the drawings, the heat contact face 141 of the heat exchange component 14 absorbs the heat generated by the heat generation component 2 and conducts the heat to the heat exchange face 142 of the heat exchange chamber 114. The heat exchange face 142 then heat-exchanges with the cooling liquid in the heat exchange chamber 114. Thereafter, the cooling liquid is exhausted from the outlet 112 of the liquid reservoir main body 11 to flow through the second flexible tube 35 into the heat sink inlet 31. After the heat sink 3 dissipates the heat of the cooling liquid, the cooling liquid flows out of the heat sink outlet 32, flows through the first flexible tube 34 and flows from the inlet 111 into the heat exchange chamber 114. By means of the circulation of the cooling liquid, the heat generated by the heat generation component 2 can be dissipated.

According to the above arrangement, the water-cooling device 1 of the present invention is connected to the heat sink 3 to form the liquid-cooling system, whereby a better heat dissipation effect can be achieved. Moreover, the stator 131 of the water-cooling device 1 is integrally embedded in the liquid reservoir main body 11 by embedded injection molding so that the structural strength of the liquid reservoir main body 11 is enhanced and the waterproof and protection effect for the stator 131 is ensured.

Figure 5:
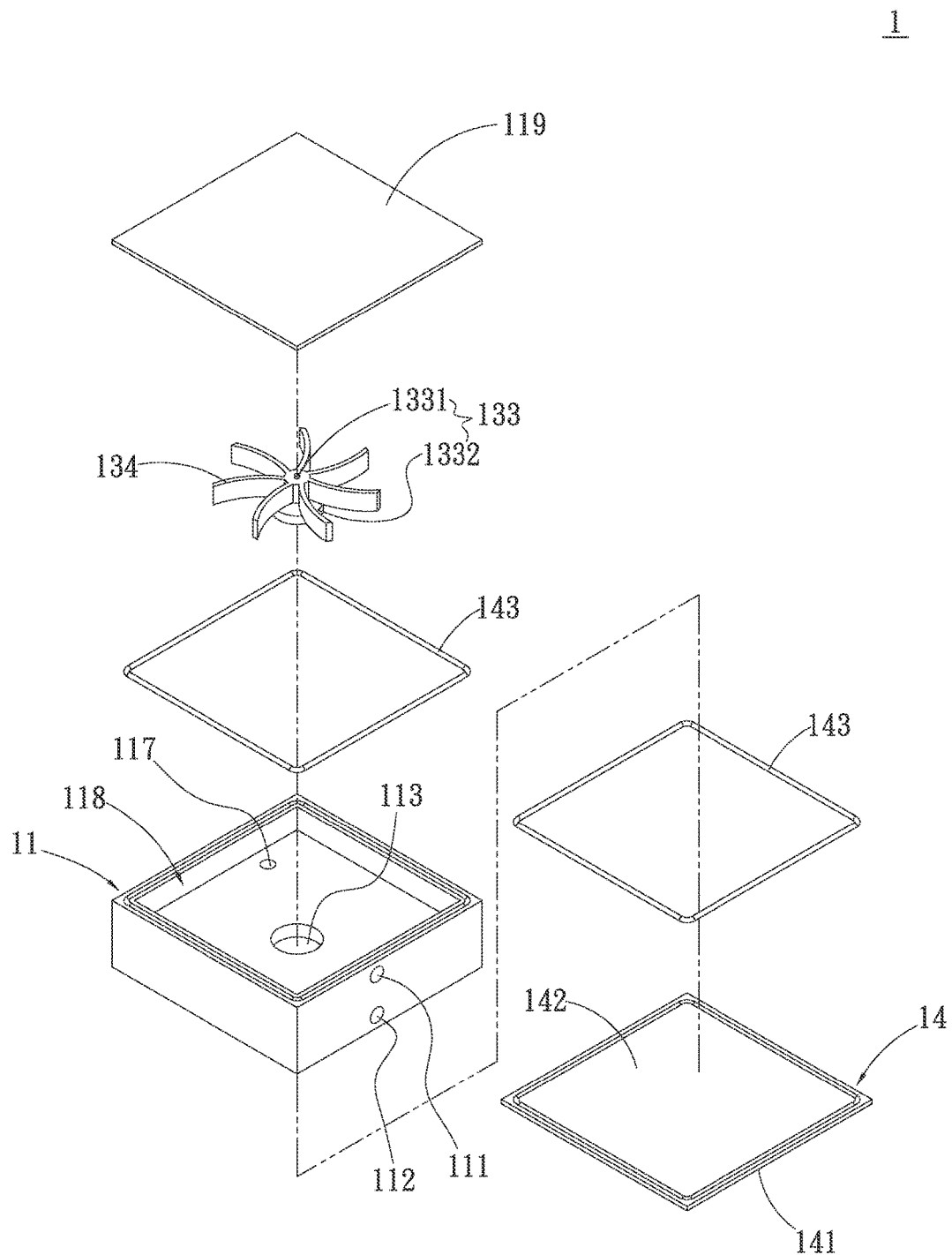
FIG. 5 is a perspective exploded view of a third embodiment of the present invention.
Figure 6:
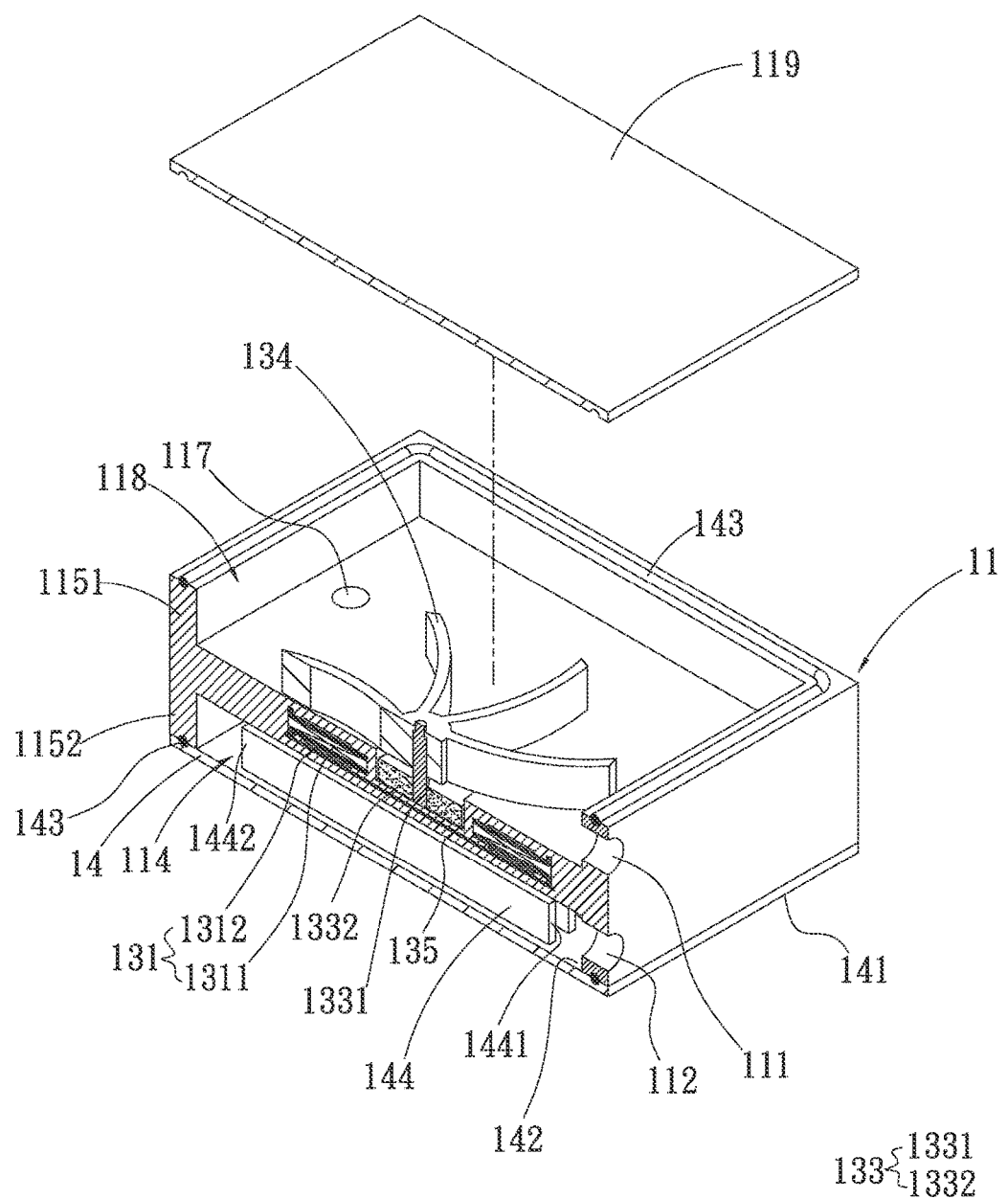
FIG. 6 is a partially sectional assembled view of the third embodiment of the present invention.

Please refer to FIGS. 5 and 6. FIG. 5 is a perspective exploded view of a third embodiment of the present invention. FIG. 6 is a partially sectional assembled view of the third embodiment of the present invention. In this embodiment, the water-cooling device 1 alternatively has an upper chamber and a lower chamber (a pump chamber 118 and a heat exchange chamber 114). The rotor 133 and the impeller 134 are received in the upper chamber, (that is, the pump chamber 118). The stator 131 is enclosed in the solid enclosure structure 16 and positioned between the upper and lower chambers of the liquid reservoir main body 11.

In this embodiment, the water-cooling device 1 includes the liquid reservoir main body 11, the pump 13 and the heat exchange component 14. The liquid reservoir main body 11 has an inlet 111, an outlet 112, a receiving space 113, an upper peripheral wall 1151, a lower peripheral wall 1152, a perforation 117, a pump chamber 118 in communication with the inlet 111, a heat exchange chamber 114 in communication with the outlet 112 and a solid enclosure structure 116. The upper and lower peripheral walls 1151, 1152 respectively upward and downward extend from the liquid reservoir main body 11. The solid enclosure structure 116 is integrally formed in the middle of the liquid reservoir main body 11. The solid enclosure structure 116 and the upper and lower peripheral walls 1151, 1152 of the liquid reservoir main body 11 together define the pump chamber 118 and the heat exchange chamber 114. The perforation 117 passes through the solid enclosure structure 116. The pump chamber 118 is correspondingly positioned above the heat exchange chamber 114. The pump chamber 118 communicates with the heat exchange chamber 114 through the perforation 117. Accordingly, the cooling liquid in the pump chamber 118 can flow through the perforation 117 into the heat exchange chamber 114. The stator 131 is isolated from the receiving space 113, the heat exchange chamber 114, the perforation 117 and the pump chamber 118.

The pump chamber 118 is for the cooling liquid to pass through. One side of the pump chamber 118 of the liquid reservoir main body 11 is recessed to form the receiving space 113. The receiving space 113 is positioned on the bottom face of the pump chamber 118 in adjacency to the corresponding solid enclosure structure 116. One side of the liquid reservoir main body 11 is recessed to form the receiving space 113. The receiving space 113 is positioned above the heat exchange chamber 114 in adjacency to the corresponding solid enclosure structure 116. The inlet 111 and the outlet 112 are disposed on a lateral side of the liquid reservoir main body 11 respectively corresponding to the pump chamber 118 and the heat exchange chamber 114. The solid enclosure structure 116 integrally encloses the stator 131 so that the thickness of the solid enclosure structure 116 can be thinned. In this case, not only the solid enclosure structure 116 can provide protection effect for the stator 131 and prevent the cooling liquid from contacting the stator 131 and reduce the total volume, but also the thickness gap between the stator 131 and the corresponding rotor 133 is shortened. Under such circumstance, the operation efficiency of the pump 13 can be greatly increased. Also, in operation of the pump 13, the heat generated by the stator 131 can be conducted to the solid enclosure structure 116 for the solid enclosure structure 116 to absorb the heat and heat-exchange with the cooling liquid in the upper pump chamber 118 and/or the lower heat exchange chamber 114 to dissipate the heat. Therefore, the heat generated by the stator 131 can be indirectly dissipated to prevent the heat from accumulating around the stator 131 and prolong the lifetime of the water-cooling device.

The heat exchange component 14 of this embodiment is substantially identical to the heat exchange component 14 (including the heat contact face 141, heat exchange face 142 and multiple radiating fins 144) of the first embodiment in structure, connection relationship and effect and thus will not be repeatedly described hereinafter. The heat exchange component 14 of this embodiment is slightly different from the heat exchange component 14 of the first embodiment in that the heat exchange component 14 of this embodiment is connected with the lower peripheral wall 1152 of the corresponding liquid reservoir main body 11. That is, the bottom section of the lower peripheral wall 1152 of the liquid reservoir main body 11 is connected with one face of the heat exchange component 14 to seal the heat exchange chamber 114. The heat exchange face 142 is in contact with the cooling liquid in the heat exchange chamber 114. The heat contact face 141 of the heat exchange component 14 is tightly attached to the corresponding heat generation component 2 (such as a central processing unit or graphics processing unit as shown in FIG. 4). The heat exchange chamber 114 is positioned between the heat exchange component 14 and the solid enclosure structure 116 of the liquid reservoir main body 11. A gasket 143 is disposed between the lower peripheral wall 1152 and the heat exchange component 14 for enhancing the connection tightness between the liquid reservoir main body 11 and the heat exchange component 14 and avoiding leakage of the cooling liquid in the heat exchange chamber 114. The connection means between the heat exchange component 14 and the liquid reservoir main body 11 is, but not limited to, insertion for illustration purposes.

In addition, the upper peripheral wall 1151 is connected with a top board 119 to seal the pump chamber 118. In this embodiment, the top board 119 is a component separable from the liquid reservoir main body 1. The top board 119 is connected with the liquid reservoir main body 1 as a part thereof. The connection means between the top board 119 and the liquid reservoir main body 11 can be screwing, adhesion or welding or any other performable means. Another gasket 143 is disposed between the top board 119 and the upper peripheral wall 1151 for enhancing the connection tightness between the liquid reservoir main body 11 and the top board 119 and avoiding leakage of the cooling liquid in the pump chamber 118. The pump 13 of this embodiment is substantially identical to the pump 13 of the first embodiment in structure, connection relationship and effect and thus will not be repeatedly described hereinafter. The pump 13 of this embodiment is slightly different from the pump 13 of the first embodiment in that the stator 131 of the pump 13 of this embodiment is integrally embedded in the solid enclosure structure 116 of the liquid reservoir main body 11 by embedded injection molding. The stator 131 is positioned between the pump chamber 118 and the corresponding heat exchange chamber 114. That is, in integral injection molding of the liquid reservoir main body 11, the stator 131 is entirely embedded and enclosed in the middle solid enclosure structure 116 of the liquid reservoir main body 11. The liquid reservoir main body 11 and the stator 131 enclosed therein form an integrated body. In the present invention, the stator 131 is integrally enclosed in the liquid reservoir main body 11 by means of embedded injection molding so that the structural strength of the liquid reservoir main body 11 is enhanced and the waterproof and protection effect for the stator 131 can be ensured.

In addition, the circuit board 135 of the stator 131, the silicon steel sheet assembly 1311 and the winding assembly 1312 wound thereon are together enclosed in the solid enclosure structure 116 of the liquid reservoir main body 11. Also, the silicon steel sheet assembly 1311 and the winding assembly 1312 wound thereon (the stator 131) and the circuit board 135 are positioned between the heat exchange chamber 114 and the pump chamber 118. The solid enclosure structure 116 of the liquid reservoir main body 11 isolates the stator 131 from contact of the cooling liquid in the heat exchange chamber 114 and the pump chamber 118. In other words, the stator 131 is not in contact with the cooling liquid. In addition, the rotor 133 and the impeller 134 of the pump 13 are respectively received in the receiving space 113 and the pump chamber 118 and exposed to the cooling liquid.

According to the design of the water-cooling device 1 of the present invention, the stator 131 is entirely enclosed in the solid enclosure structure 116 of the liquid reservoir main body 11 to increase the structural strength of the liquid reservoir main body 11 and achieve the protection effect for the stator 131. Furthermore, the solid enclosure structure 116 of the liquid reservoir main body 11 provides a very good sealing effect so that the water or alien objects (such as salt fog or dust or other liquid) are effectively prevented from infiltrating into and rusting the stator 131.

In a modified embodiment, the heat exchange component 14 is free from any radiating fin. Instead, the heat exchange face 142 absorbs the heat and directly heat-exchanges with the cooling liquid to dissipate the heat.

In a modified embodiment, the water-cooling device 1 of the present invention is connected with a heat sink to form a liquid-cooling system. The heat sink is positioned in a position distal from the liquid reservoir main body 11. The heat sink is connected to the inlet 111 and outlet 112 of the liquid reservoir main body 11 respectively through multiple flexible tubes. The impeller 134 in the pump chamber 118 serves to drive the cooling liquid to circularly flow within the heat exchange chamber 114 and the heat sink. In addition, the heat sink can be connected with a fan to help the heat sink to quickly dissipate the heat.

In conclusion, in comparison with the conventional water-cooling device, the present invention has the following advantages:

1. The stator 131 is entirely enclosed in the solid enclosure structure 116 of the liquid reservoir main body 11 to increase the structural strength of the liquid reservoir main body 11.

2. The present invention is able to protect the stator 131 and prevent the water or alien objects (such as salt fog or dust or other liquid) from infiltrating into and rusting the stator 131.

3. The total volume of the water-cooling device is reduced and the thickness gap between the stator 131 and the corresponding rotor 133 is shortened, whereby the operation efficiency of the pump is greatly increased.

The present invention has been described with the above embodiments thereof and it is understood that many changes and modifications in the above embodiments can be carried out without departing from the scope and the spirit of the invention that is intended to be limited only by the appended claims

What is claimed is:

1. A water-cooling device comprising:
   a monolithic liquid reservoir having an inlet, an outlet, a receiving space, a solid enclosure structure, and a heat exchange chamber in fluid communication with the receiving space, the inlet, and the outlet, one side of the heat exchange chamber being recessed to form the receiving space, and the receiving space and heat exchange chamber containing a cooling liquid;
   a pump circulating the cooling liquid, the pump including a stator, a circuit board, and a rotor, the stator and circuit board being entirely enclosed and integrally embedded in the monolithic liquid reservoir such that the solid enclosure structure encloses an outer surface of the stator and of the circuit board such that the stator is isolated from the receiving space and from the heat exchange chamber, the rotor being connected with an impeller, the rotor and the impeller being respectively disposed in the receiving space and the heat exchange chamber and exposed to the cooling liquid; and
   a heat exchange component connected with the monolithic liquid reservoir, the heat exchange component having a heat contact face and a heat exchange face, the heat exchange face being in contact with the cooling liquid in the receiving space and heat exchange chamber.

2. The water-cooling device as claimed in claim 1, wherein the stator includes a silicon steel sheet assembly and a winding assembly wound on the silicon steel sheet assembly, wherein the silicon steel sheet assembly, the circuit board, and the winding assembly are together enclosed in the monolithic liquid reservoir and positioned outside the receiving space and heat exchange chamber, the solid enclosure structure of the monolithic liquid reservoir isolating the stator from contact with the cooling liquid in the receiving space and heat exchange chamber, the inlet and the outlet being respectively disposed on two lateral sides of the monolithic liquid reservoir.

3. The water-cooling device as claimed in claim 1, wherein the rotor has a shaft and a magnetic member, one end of the shaft being connected with the impeller, the other end of the shaft being rotatably disposed at a bottom of the receiving space, the magnetic member being fitted on the other end of the shaft, the magnetic member being separated from the stator by the monolithic liquid reservoir corresponding to the stator.

4. The water-cooling device as claimed in claim 1, wherein the monolithic liquid reservoir has a peripheral wall connected with the heat exchange component to seal the heat exchange chamber.

5. The water-cooling device as claimed in claim 1, wherein the heat exchange component further includes multiple radiating fins disposed on the heat exchange face, each radiating fin having a first end proximal to the impeller and a second end radially extending away from the impeller.

6. The water-cooling device as claimed in claim 1, wherein the heat contact face is attached to a corresponding heat generation component and serves to absorb the heat generated by the heat generation component and conduct the heat to the heat exchange face.

7. The water-cooling device as claimed in claim 5, wherein the monolithic liquid reservoir main body is connected to a heat sink, the heat sink being connected to the inlet of the monolithic liquid reservoir main body via a first flexible tube and connected to the outlet of the monolithic liquid reservoir main body via a second flexible tube, the heat sink being positioned in a position distal from the monolithic liquid reservoir main body.

* * * * *